United States Patent [19]

Hayakawa et al.

[11] Patent Number: 4,882,708

[45] Date of Patent: Nov. 21, 1989

[54] SEMICONDUCTOR MEMORY DEVICE

[75] Inventors: Shigeyuki Hayakawa; Mitsuo Isobe, both of Yokohama; Takayuki Ohtani, Tokyo, all of Japan

[73] Assignee: Kabushiki Kaisha Toshiba, Kawasaki, Japan

[21] Appl. No.: 145,411

[22] Filed: Jan. 19, 1988

[30] Foreign Application Priority Data

Jan. 19, 1987 [JP] Japan .................................. 62-9281

[51] Int. Cl.⁴ .............................................. G11C 7/00
[52] U.S. Cl. ................................ 365/189.04; 365/190; 365/218
[58] Field of Search ................ 365/189, 203, 230, 233, 365/189.04, 218, 190, 202

[56] References Cited

U.S. PATENT DOCUMENTS 4,567,578  1/1986  Cohen et al. ......................... 365/189
4,680,734  7/1987  Baba et al. .......................... 365/190
4,758,990  7/1988  Uchida ............................... 365/190

FOREIGN PATENT DOCUMENTS 60-197994  10/1965  Japan .

*Primary Examiner*—Joseph A. Popek
*Attorney, Agent, or Firm*—Finnegan, Henderson, Farabow, Garrett and Dunner

[57] ABSTRACT

A precharge circuit is provided between bit lines, on the one hand, and a power source potential on the other. The precharge circuit is controlled to be conductive/-nonconductive by a clear signal. A control unit is also provided, which controls a decoder when the clear signal is supplied so as to set all the word lines in a selective state. In a clear mode, writing circuits write the same data simultaneously into all of the memory cells.

6 Claims, 9 Drawing Sheets

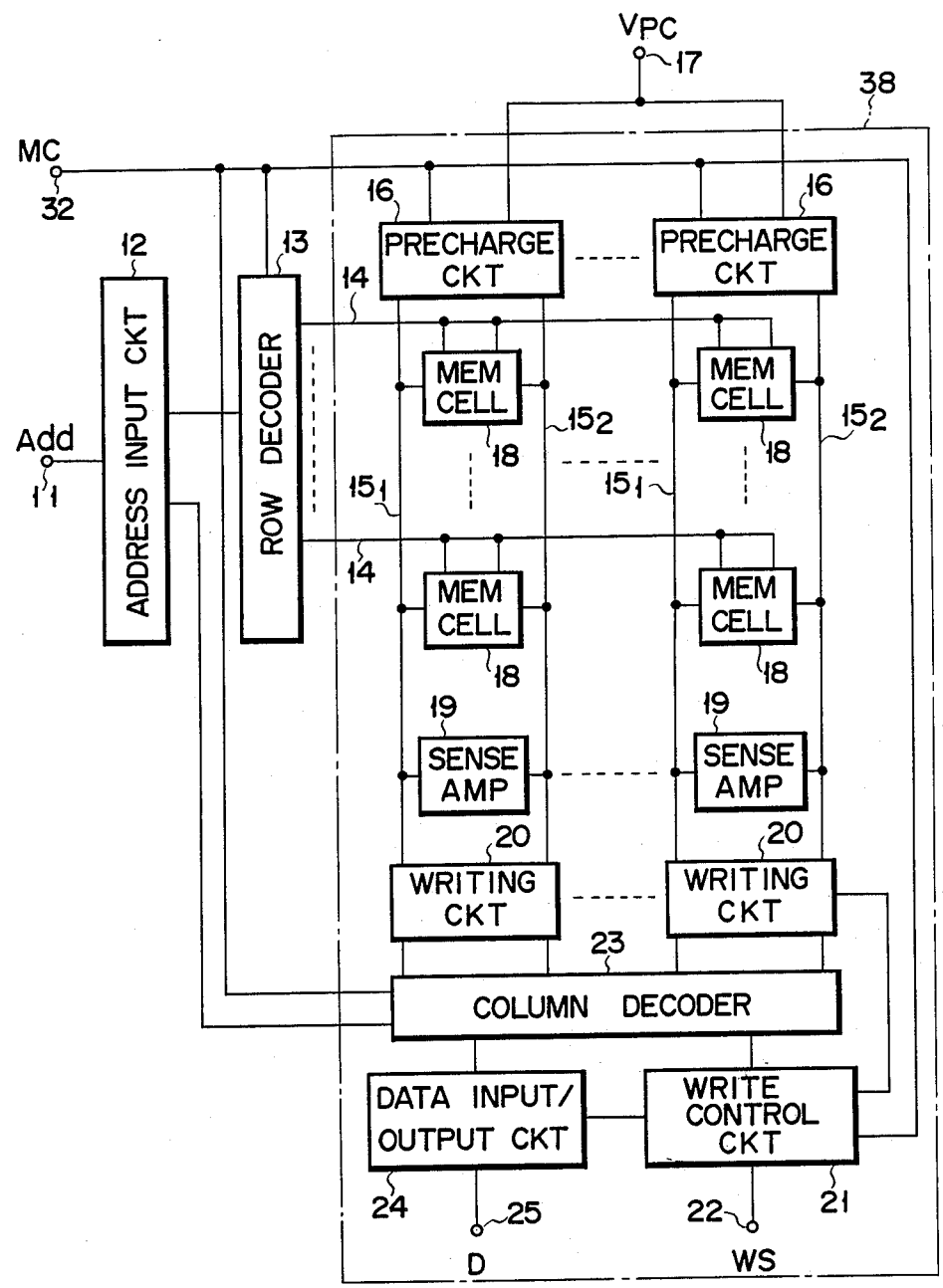
F I G. 6

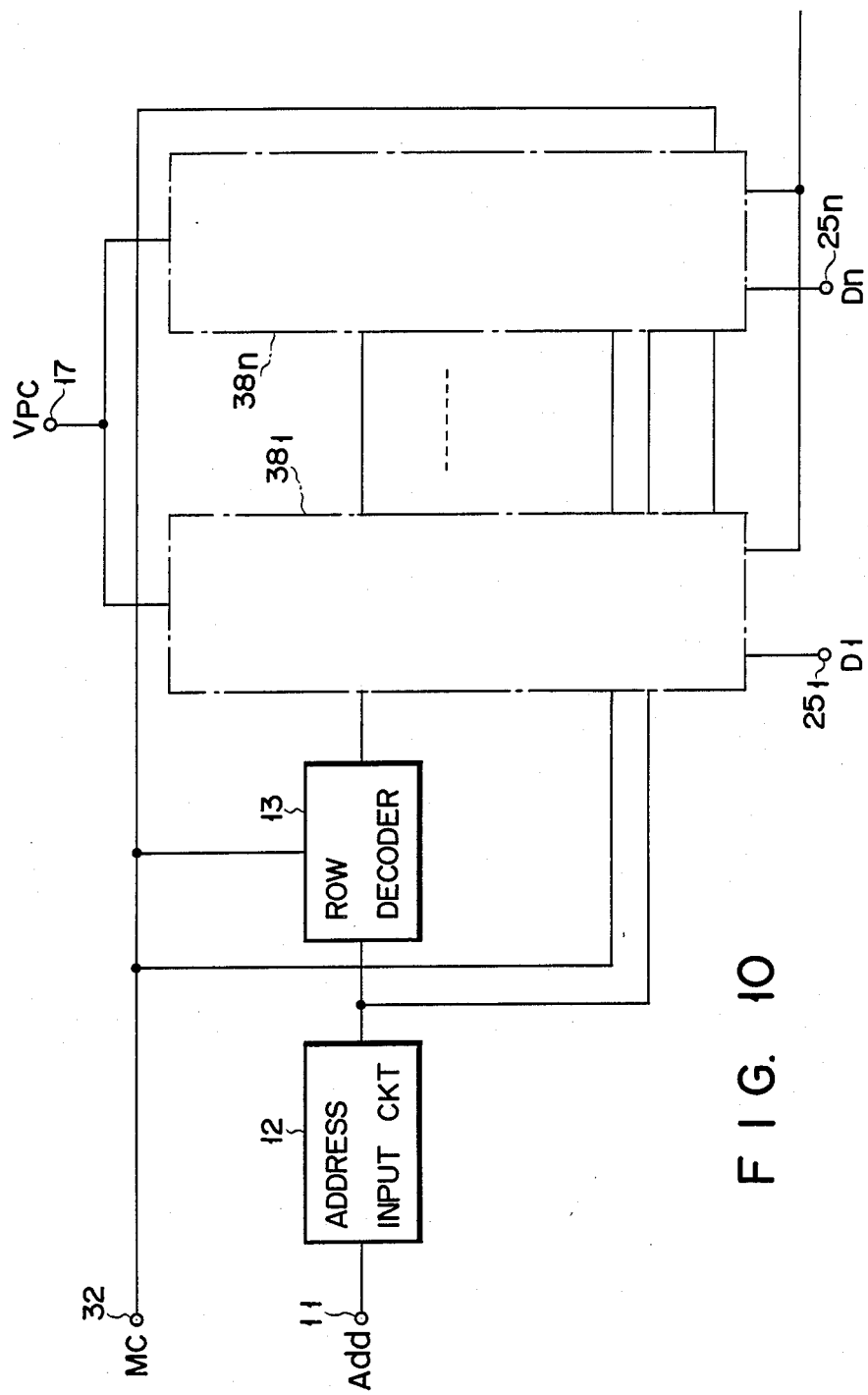
F I G. 10

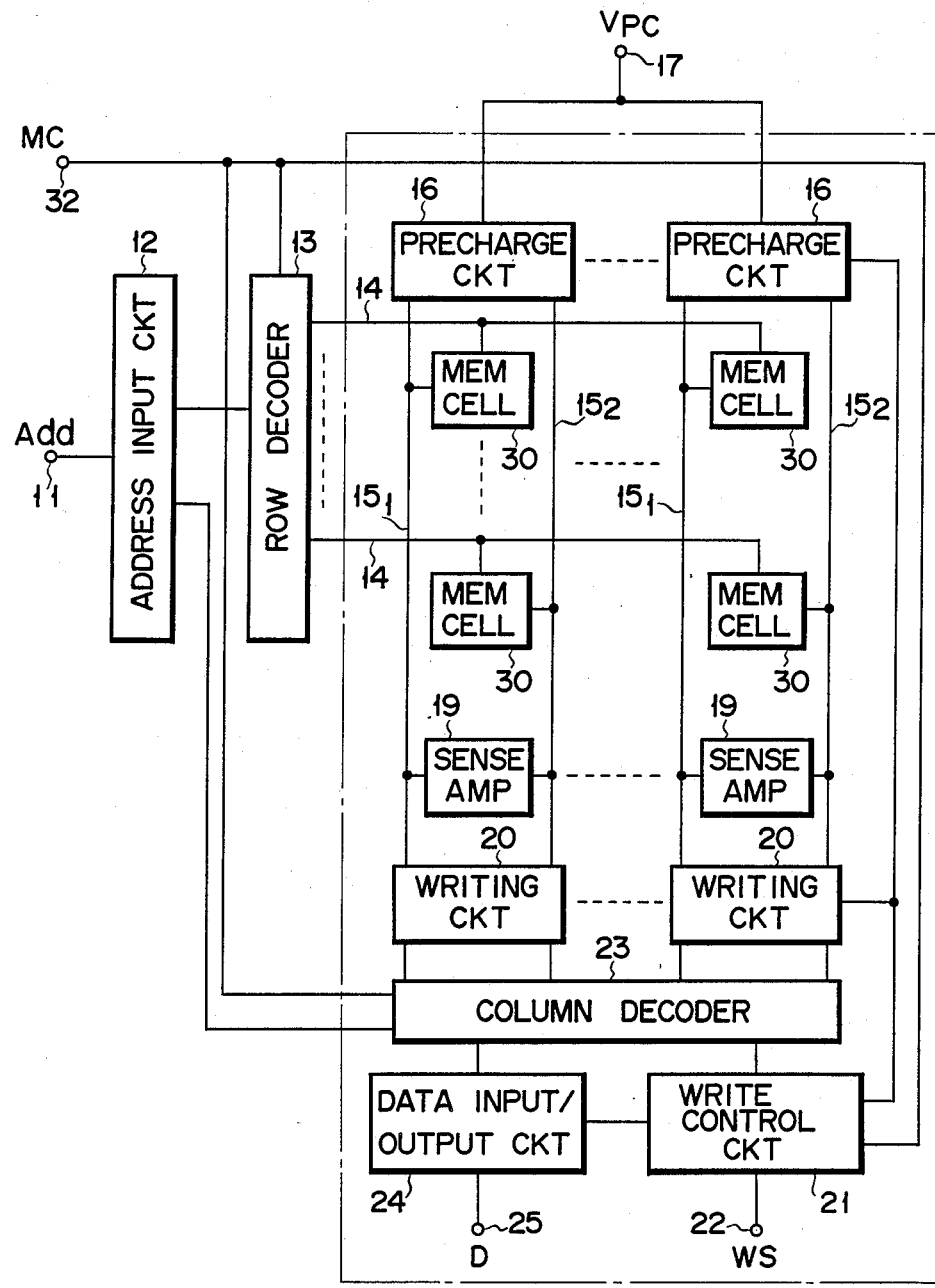
F I G. 11

SEMICONDUCTOR MEMORY DEVICE

BACKGROUND OF THE INVENTION

This invention relates to a semiconductor memory device, and, more particularly, to a control for simultaneously writing data into a plurality of memory cells in a random access memory (RAM).

A prior art static random-access memory (abbreviated to SRAM) has the configuration shown in FIG. 1. In the figure, reference numeral 11 denotes an address input terminal for receiving address signal Add. Numeral 12 denotes an address input circuit for receiving address signal Add input from address input terminal 11. Numeral 13 denotes a row decoder for decoding a row address signal supplied from address input circuit 12. Numeral 14 denotes a plurality of word lines. One of the word lines 14 is selected and driven by the output of row decoder 13. Numerals $15_1$ and $15_2$ denote a plurality of paired bit lines crossing word lines 14. Numeral 16 denotes a plurality of precharge circuits respectively provided between pairs of bit lines $15_1$ and $15_2$, on one hand, and precharge power source Vpc terminal 17 (which may be of high-potential power source $V_{DD}$), on the other hand. Numeral 18 denotes a plurality of static memory cells. Memory cells 18 are respectively connected to paired bit lines $15_1$ and $15_2$ arrayed in rows and word lines arrayed orthogonally to the bit lines. Numeral 19 denotes sense amplifiers. One sense amplifier is connected to each pair of bit lines $15_1$ and $15_2$. Numeral 20 denotes writing circuits. One writing circuit is connected to one pair of bit lines $15_1$ and $15_2$. Numeral 21 denotes a write control circuit for controlling the write operation of writing circuits 20 by write signal WS from write signal terminal 22. Numeral 23 denotes a column decoder for decoding a column address signal supplied from address input circuit 12, to select and drive each pair of bit lines $15_1$ and $15_2$. Numeral 24 denotes a data input/output circuit for transferring data D, via data input/output terminal 25, from writing circuit 20 and bit lines $15_1$ and $15_2$ to an external apparatus and vice versa.

Precharge circuit 16, memory cells 18, writing circuit 20 have configurations shown in FIG. 2, for example. Precharge circuit 16 includes P-channel MOS FETs (metal oxide semiconductor field effect transistors) Q1 and Q2. The sources of transistors Q1 and Q2 are connected to precharge power source Vpc terminal 17. The drains of transistors Q1 and Q2 are connected to bit lines $15_1$ and $15_2$, respectively. The gates of transistors Q1 and Q2 are both connected to ground. In a read mode, transistors Q1 and Q2 apply the potential Vpc of terminal 17 to bit lines $15_1$ and $15_2$, respectively.

Memory cell 18 includes N-channel MOS FETs Q3 and Q4 as drivers, N-channel MOS FETs Q5 and Q6 as transfer gates, and high-resistance load resistors R1 and R2. First terminals of transistors Q5 and Q6 are connected to bit lines $15_1$ and $15_2$, respectively. The gates of transistors Q5 and Q6 are both connected to word line 14. The sources of transistors Q3 and Q4 are both connected to ground. The gate of transistor Q3 is connected to the drain of transistor Q4, and the drain of transistor Q3 is connected to the gate of transistor Q4. The drains of transistors Q3 and Q4 are connected to the second terminals of transistors Q5 and Q6, respectively. High-resistance load resistor R1 is connected between the drain of transistor Q3 and power source $V_{DD}$. High-resistance load resistor R2 is connected between the drain of transistor Q4 and power source $V_{DD}$. Transistors Q3 and Q4 and high-resistance load resistor R1 and R2 make up a flip-flop. This flip-flop stores the data supplied from the pair of bit lines $15_1$ and $15_2$ via transistors Q5 and Q6.

Writing circuit 20 includes N-channel MOS FETs Q7 and Q8, both for line selection. The drains of transistors Q7 and Q8 are connected to bit lines $15_1$ and $15_2$, respectively. The sources of transistors Q7 and Q8 are connected to write control circuit 21 (FIG. 1) via write control lines $26_1$ and $26_2$, respectively. The gates of transistors Q7 and Q8 are supplied with the decode output of column decoder 23.

A decoding element for one row in row decoder 13, or a decoding element for one column (for a pair of bit lines $15_1$ and $15_2$) in column decoder 23 has the configuration shown in FIG. 3. Address signal Add is supplied to NAND gate 27. The logical state of the output of NAND gate 27 is inverted by inverter 28. The output of inverter 28, i.e., the output of decoder 13 or 23, is supplied to decode output line 29 (a word line or a column select line). When this output is at "1" level, the word line or the column select line is selected.

The operation of the SRAM shown in FIG. 1 will now be described. In a read mode, address signal Add is supplied to address input circuit 12 from address input termInal 11. The row address signal output from address input circuit 12 is supplied to row decoder 13. The column address signal output from address input cirCuit 12 is supplied to column decoder 23. On the basis of the decode output of row decoder 13, one word line 14 is selected. Memory cells 18, 18, ... in the same row, that are connected to the selected word line 14, are then selected. Due to the stored data read out from the selected memory cells 18, 18, ..., a potential difference occurs between paired bit lines $15_1$ and $15_2$. The potential difference is amplified by sense amplifier 19. Stored data D on the pair of bit lines $15_1$ and $15_2$ of the column selected by decoder 23 is output from data input/output terminal 25 via data input/output circuit 24. In the read-mode, write signal terminal 22 is at the read-mode level. Writing circuits 20, 20, ... are made inoperable by the output of write control circuit 21.

A write operation progresses in the same way as that of the read operation until one word line 14 is selected. Write signal terminal 22 is at the write-mode level. The output of write control circuit 21 enables writing circuit 20 to be ready for the write operation. Data D supplied to data input/output terminal 25 is written via data input/output circuit 24 and column decoder 23 into memory cell 18 connected to the pair of bit lines $15_1$ and $15_2$ in the column which has been selected by column decoder 23.

FIG. 4 shows a prior art dynamic random access memory (abbreviated to DRAM). In the figure, the components similar to those in FIG. 1 are denoted by the same reference numerals. This memory differs from the SRAM in the connection of memory cells 30 to the peripheral circuits, and in the use of precharge circuit control signal line 31 between writing circuit 20 and precharge circuit 16. Precharge circuit 16, memory cell 30, and writing circuit 20 have configurations shown in FIG. 5. Precharge circuit 16 includes P-channel MOS FETs Q9 and Q10. The sources of transistors Q9 and Q10 are connected to precharge power source Vpc terminal 17. The drains of transistors Q9 and Q10 are connected to bit lines $15_1$ and $15_2$, respectively. The output of write control circuit 21 is supplied to the gates of transistors Q9 and Q10, via precharge control signal line 31.

Memory cell 30 includes N-channel MOS FET Q11 as a transfer gate, and capacitor C. The first terminal of transistor Q11 is connected to bit line $15_1$. The gate is connected to word line 14. Capacitor C is connected between the second terminal of transistor Q11 and ground. Data D supplied from bit line $15_1$ via transistor Q11 is stored in capacitor C. When the data D is at the "1" level, capacitor C is charged. When the data D is at the "0" level, capacitor C is not charged. Depending on the level of data D, the electric charge is present or absent in capacitor C.

Writing circuit 20 has the same configuration as that in the SRAM of FIG. 2. The decoding element for one row in row decoder 13, or the decoding element for one column (for a pair of bit lines $15_1$ and $15_2$) in Column deCoder 23 also has the configuration Shown in FIG. 3.

The write operation of the DRAM will be described. Prior to writing data, transistors Q9 and Q10 of precharge circuit 16 are turned on by the output signal of write control circuit 21, thereby precharging a pair of bit lines $15_1$ and $15_2$ to a level of VDD/2. The subsequent operation is the same as that of the SRAM.

In either prior art semiconductor memory device, it is possible to perform read and write operations for a memory cell as specified by one address. However, when the same data is to be written into all the memory cells (for example, memory cell data clear operation for writing data "0" into all the memory cells), it is necessary to sequentially perform the write operations for all memory cells, while changing the addresses. In the case of a 64K-bit semiconductor memory device, $2^{15}$ (=65536) address-inputting operations of $2^{15}$ (=65536) and the same number of data-writing operations are required. Since the semiconductor memory device cannot be used while the data is being cleared, a system using this semiconductor memory device (e.g., an image data processing system using a microcomputer) cannot operate efficiently.

As described above, the prior semiconductor memory device executes the address selection only once for one memory cell. Therefore, in a data clear mode, it needs much time for writing the same data into all memory cells.

SUMMARY OF THE INVENTION

Accordingly, an object of this invention is to provide a semiconductor memory device in which the same data can be simultaneously written into all memory cells.

In this embodiment, precharge circuit means which is made nonconductive by a memory clear signal, is provided between paired bit lines, on one hand, and a potential supply source, on the other hand. Control means is further provided, which controls the decoder, at the time of supplying the memory clear signal, to set all of the word lines in a selective state. With this control means, the same type of data can be written, at a time, into all of the memory cells by the writing circuit at the time of memory clear signal supply.

According to the present invention, there is provided a semiconductor memory device for simultaneously writing same data into all memory cells by a writing circuit in a clear mode, the device comprising a plurality of memory cells for storing data, bit lines for performing data transfer to and from the memory cells, a sense amplifier for amplifying the data read out onto the bit lines, a writing circuit for writing data into the memory cells via the bit lines, word lines for selecting the memory cells, a row decoder for selecting the word lines, a column decoder for selecting the bit lines, an address input circuit for supplying an address signal to the column decoder, load means provided between the bit lines and a potential source for supplying a predetermined potential, the load means being set in an off-state by the supply of the memory clear signal, and control means for controlling the decoder when the memory clear signal is supplied so as to set all the work lines in a selective state.

BRIEF DESCRIPTION OF THE DRAWINGS

FIG. 6 shows a block diagram of a first embodiment of a semiconductor memory device according to this invention, in which this invention is applied for a SRAM;

FIGS. 10 and 11 show block diagrams illustrating a third and a fourth embodiment of this invention, respectively.

DETAILED DESCRIPTION OF THE PREFERRED EMBODIMENTS

Figure 1:
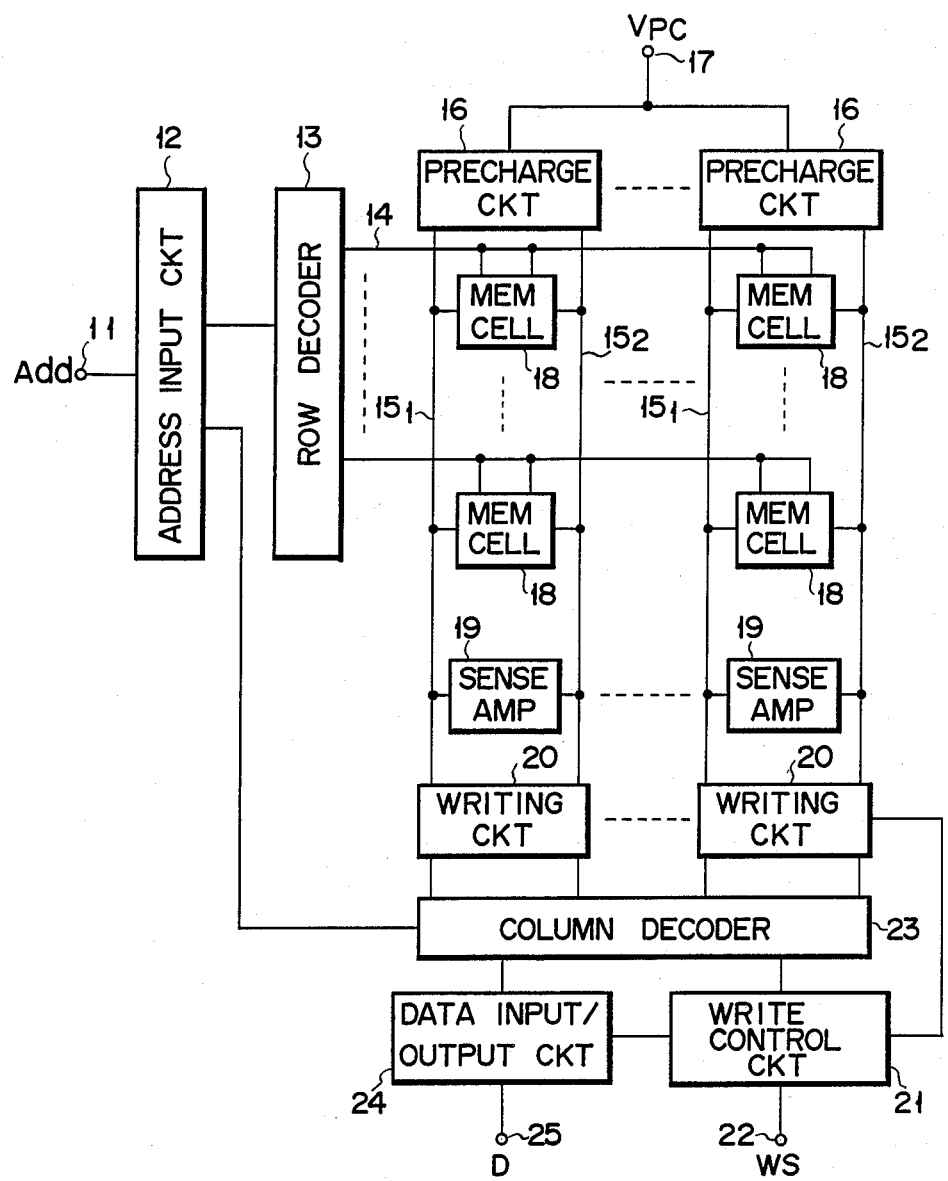
FIG. 1 shows a block diagram illustrating a prior art semiconductor memory device.

Some specific embodiments of this invention will now be described, referring to the accompanying drawings. FIG. 6 shows an SRAM. In the figure, the same components as those in FIG. 1 are denoted by the same reference numerals. The difference of the FIG. 6 circuit from the FIG. 1 circuit is that it includes memory clear terminal 32 to which memory clear signal MC is supplied. The memory clear terminal 32 is connected to row decoder 13, precharge circuit 16, write control circuit 21, and column decoder 23. With the supplied memory clear signal MC, row decoder 13 (whose configuration is shown in detail in FIG. 7) simultaneously selects all of the word lines 14. At the same time, precharge circuit 16 disconnect the paired bit lines $15_1$ and $15_2$ from precharge power source Vpc terminal 17. Under this condition, the writing circuits 20, 20, . . . simultaneously write predetermined data into respective memory cells 18, 18, . . . .

The FIG. 6 configuration will now be described in detail. In the figure, reference numeral 11 denotes an address input terminal for receiving address signal Add. Reference numeral 12 denotes an address input circuit for receiving address signal Add input from address input terminal 11. Reference numeral 13 denotes a row decoder for decoding a row address signal supplied from address input circuit 12. Reference numeral 14 denotes a plurality of work lines. One of the word lines 14 is selected and driven by the output of row decoder 13. Reference numerals 15₁ and 15₂ denote a plurality of paired bit lines crossing word lines 14. Reference numeral 16 denotes a plurality of precharge circuits provided between pairs of bit lines 15₁ and 15₂, on one hand, and precharge power source Vpc terminal 17 (which may be or high-potential power source $V_{DD}$), on the other hand. Reference numeral 18 denotes a plurality of static memory cells. Memory cells 18 are connected to paired bit lines 15₁ and 15₂ arrayed in rows and word lines arrayed orthogonally to the bit lines. Reference numeral 19 denotes sense amplifiers. One sense amplifier is connected to each pair of bit lines 15₁ and 15₂. Reference numeral 20 denotes writing circuits. One writing circuit is connected to one pair of bit lines 15₁ and 15₂. Reference numeral 21 denotes a write control circuit for controlling the write operation of writing circuits 20 by write signal WS from write signal terminal 22. Reference numeral 23 denotes a column decoder for decoding a column address signal supplied from address input circuit 12, to select and drive each pair of bit lines 15₁ and 15₂. Reference numeral 24 denotes a data input/output circuit for transferring data D, via data input/output terminal 25, from writing circuit 20 and bit lines 15₁ and 15₂ to an external apparatus and vice versa.

Figure 3:
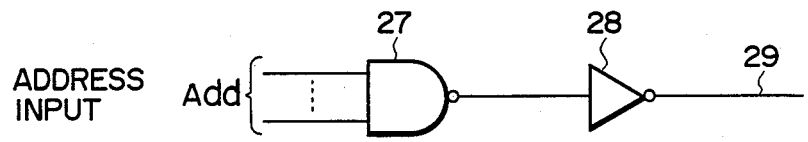
FIG. 3 shows a configuration of a row decoder of the FIG. 1 device.
Figure 4:
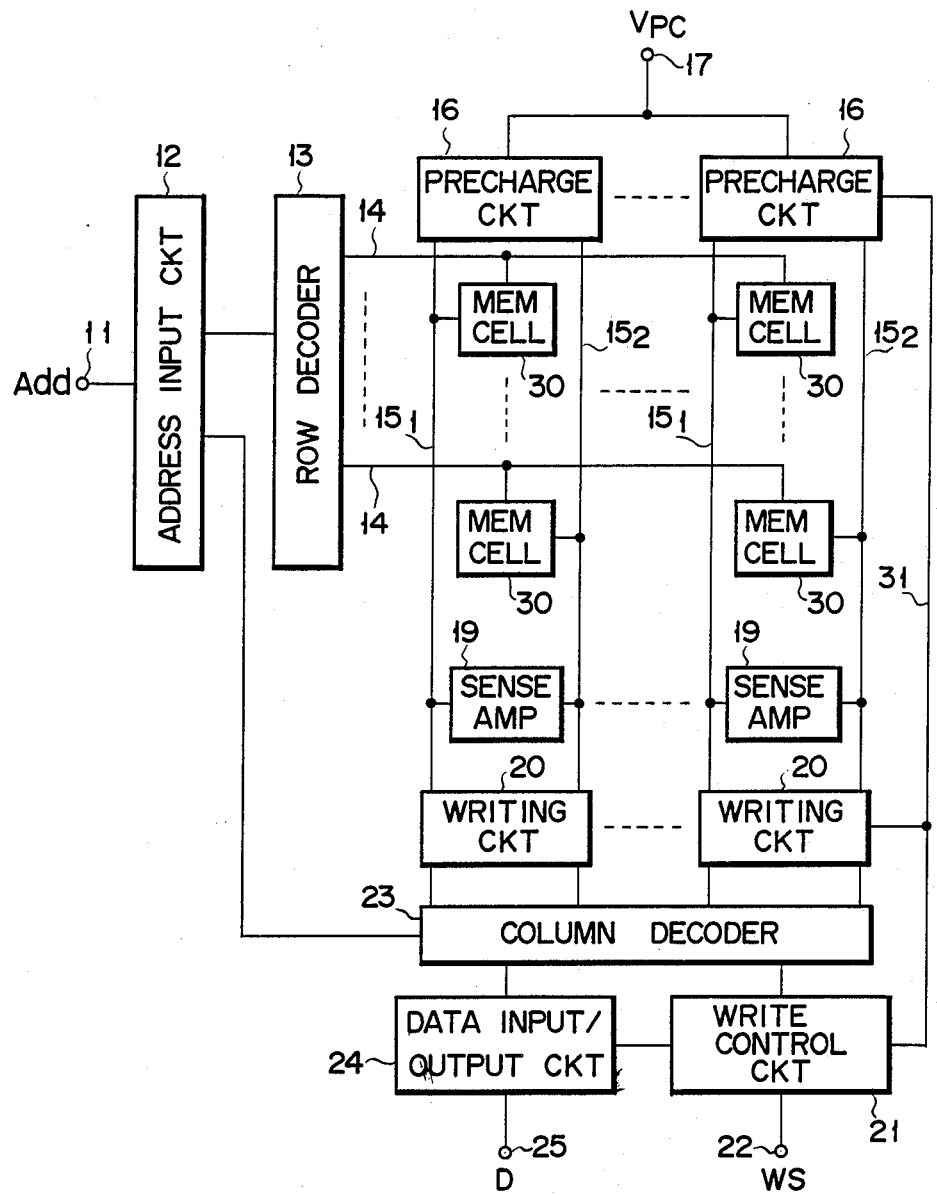
FIG. 4 shows a block diagram of another prior art semiconductor memory device.
Figure 7:
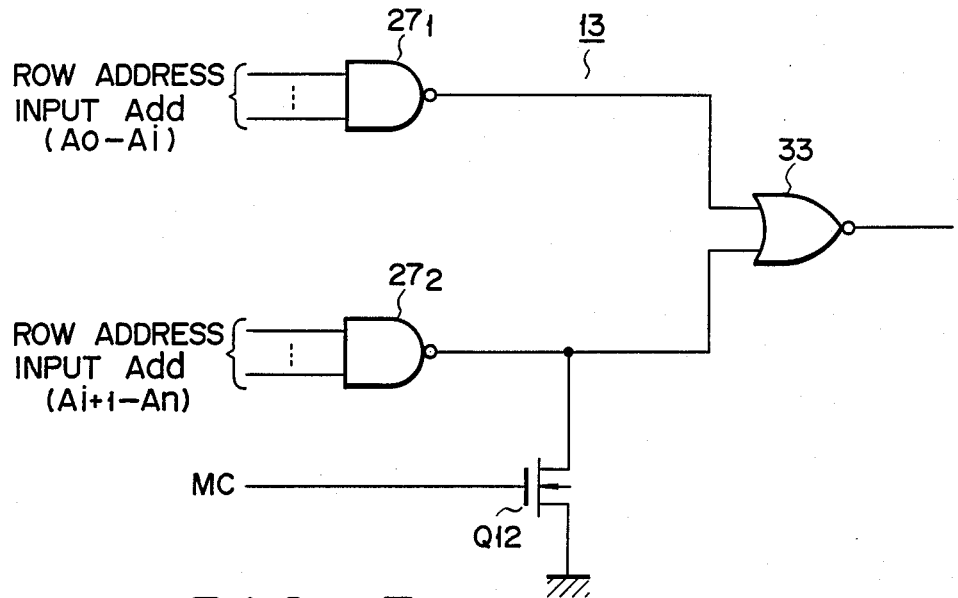
FIG. 7 shows a configuration of a row address decoder of the FIG. 1 device.

FIG. 7 shows an example of a configuration of row decoder 13 in the FIG. 6 circuit. Two NAND gates 27₁ and 27₂ are provided, instead of NAND gate 27 shown in FIG. 3. NOR gate 33 is connected between the output terminals of NAND gates 27₁ and 27₂. N-channel MOS FET Q12 for clearing is provided between the output terminal and ground, and its conduction is controlled by memory clear signal MC. NAND gates 27₁ and 27₂ are both supplied with row address signal Add (Ao-Ai, Ai+1—An). In the semiconductor memory as configured above, when memory clear signal MC is at "0" level, the row decoder 13 in FIG. 7 performs substantially the same operation as the decoder 13 in FIG. 3. That is, when the output of NOR gate 33, i.e., the output of decoder 13 is at "1" level, the word line is selected. On the other hand, when memory clear signal MC is at "1" level, transistor Q12 for clearing is turned on. Therefore, AND gate 27₂ is forcibly set to "0" level. The output of NOR gate 33 is set to a word line select level only when row address signals Add1 are all at "1", all of the memory cells 18, 18, . . . , which are connected to the word line selected at that time, are set in a selective condition.

Figure 2:
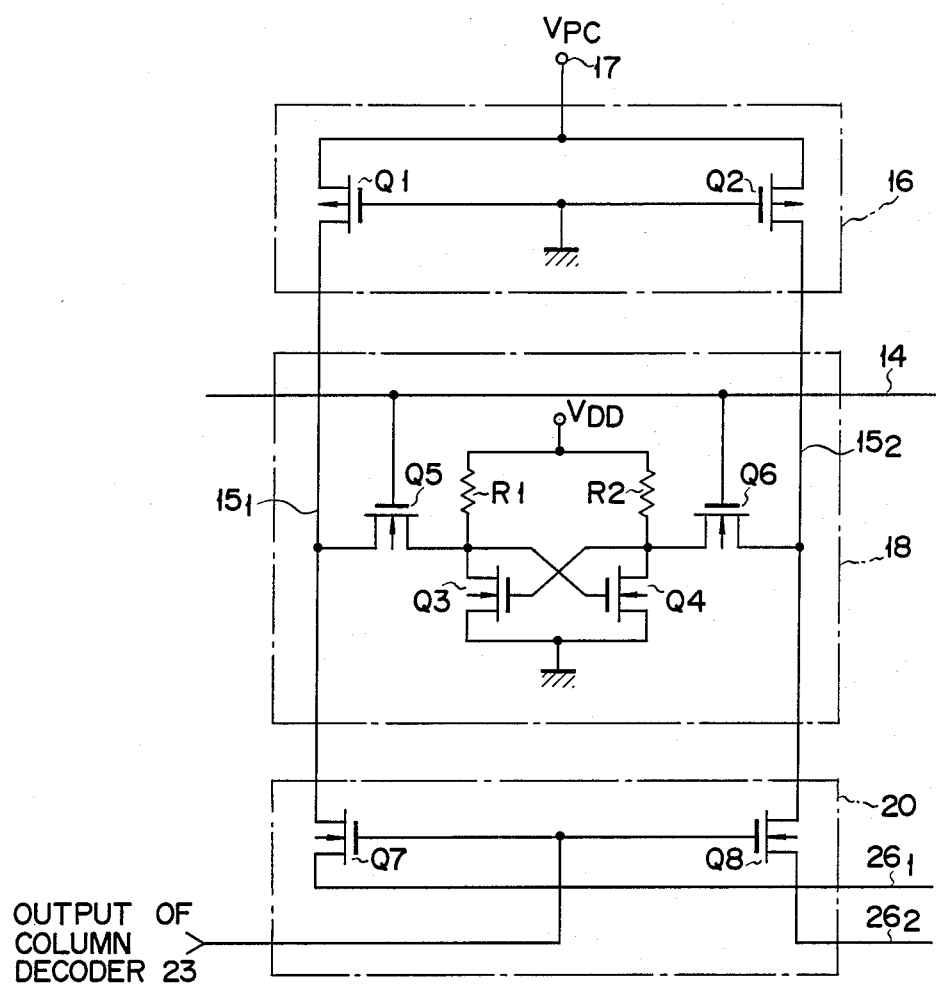
FIG. 2 shows configurations of a precharge circuit, a memory cell and a writing circuit of the FIG. 1 device.
Figure 8:
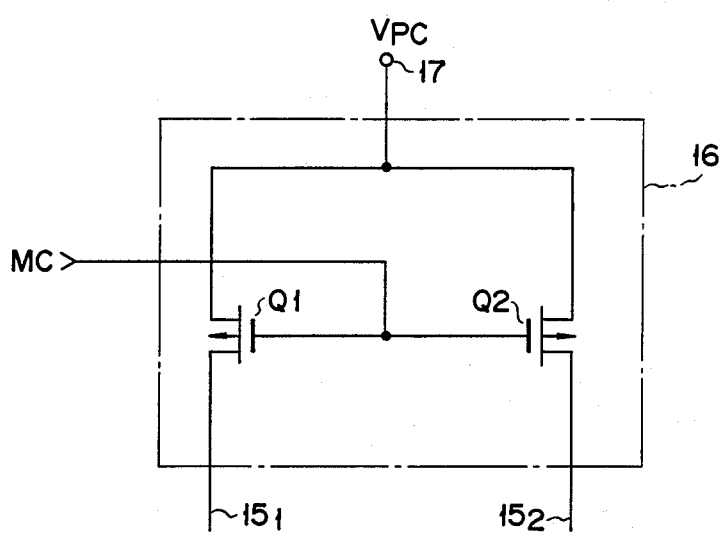
FIG. 8 shows a configuration of a precharge circuit of the FIG. 1 device.

Precharge circuit 16 has a configuration shown in FIG. 8. While, in FIG. 2, transistors Q1 and Q2 are grounded, in FIG. 8, transistors Q1 and Q2 are connected to memory clear terminal 32, so as to be turned on and off by memory clear signal MC. When memory clear signal MC is at "0" level, transistors Q1 and Q2 are turned on, and the precharge circuit 16 performs the same operation as the precharge circuit in FIG. 2. When the signal is at "1" level, transistors Q1 and Q2 are turned off, and the pair of bit lines 15₁ and 15₂ are disconnected from precharge power source Vpc terminal 17.

Figure 9:
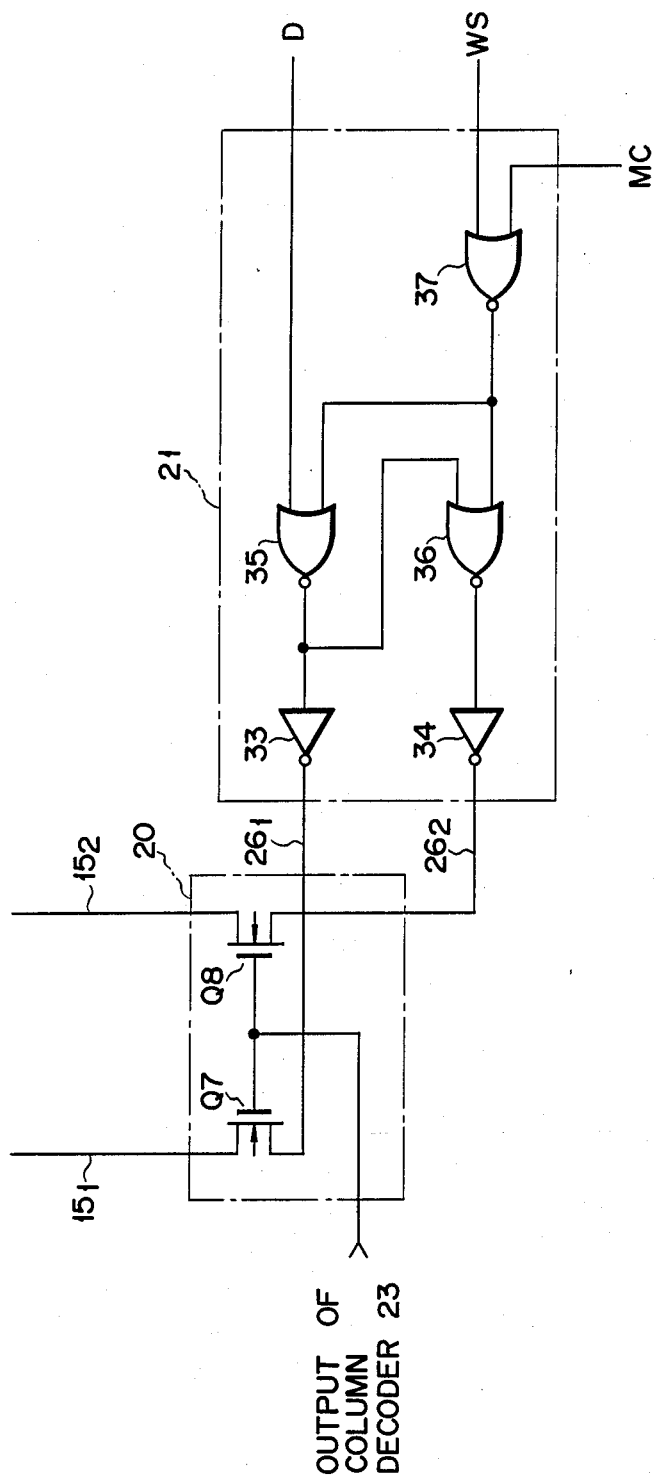
FIG. 9 shows a configuration of the write control circuit of the FIG. 1 device.

FIG. 9 shows examples of the configurations of writing circuit 20 and write control circuit 21 in FIG. 6. The write control circuit 21 includes inverters 33 and 34, and three NOR gates 35, 36 and 37. The output terminals of inverters 33 and 34 are connected to the first terminals of transistors Q7 and Q8 in the writing circuit 20, respectively. Data D is supplied to the first input terminal of NOR gate 35. The output of NOR gate 37 is supplied to the second input terminal of NOR gate 35. The output of NOR gate 35 is supplied to the input terminal of inverter 33 and the first input terminal of NOR gate 36. The output of NOR gate 37 is supplied to the second input terminal of NOR gate 36. The output of NOR gate 36 is supplied to inverter 34. Write control signal WS is supplied to the first input terminal of NOR gate 37. Memory clear signal MC is supplied to the second input terminal of NOR gate 37.

In the writing circuit 20 and the write control circuit 21, which are configured above, when memory clear signal MC is at "0" level, the read and write operations are controlled by write control signal WS. In the write operation, write control WS is at 1" level, data D is written into memory cell 18 from the output terminals of inverters 33 and 34 via transistors Q7 and Q8 and the pair of bit lines 15₁ and 15₂. In the read operation, write control signal WS is at "0" level, and the output of inverters 33 and 34 are at "1" irrespective of the level of data D. Therefore, the data is not written into the memory cell. When memory clear signal MC is at "1", the input data D is transferred to the pair of bit lines 15₁ and 15₂, irrespective of the level of write control signal WS. The data D is written into memory cell 18. When memory clear signal MC is at "1" level, all of the word lines 14 and all of the column decode lines are selected. Therefore, the data D is written into all of the memory cells 18, 18, . . . . At this time, irrespective of whether the level of the data D is "0" or "1", the same data D is written into all the memory cells 18, 18, . . . .

Next, the operation of the FIG. 6 circuit will be described. When memory clear signal MC which is supplied to memory clear terminal 32 is at "0" level, the operation is the same as that in the SRAM of FIG. 1.

In a read mode, address signal Add is supplied to address input circuit 12 from address input terminal 11. The row address signal output from address input circuit 12 is supplied to row decoder 13. The column address signal output from address input circuit 12 is supplied to column decoder 23. On the basis of the decode output of row decoder 13, one word line 14 is selected. Memory cells 18, 18, . . . in the same row that are connected to the selected word line 14, are then selected. On the basis of the stored data read out from the selected memory cells 18, 18, . . . , a potential difference occurs between paired bit lines 15₁ and 15₂. The potential difference across bit lines 15₁ and 15₂ is amplified by sense amplifier 19. Stored data D of the pair of bit lines 15₁ and 15₂ of the column selected by column decoder 23 is output from data input/output terminal 25 via data input/output circuit 24. In the read mode, write signal terminal 22 is at the read-mode level. Writing circuits 20, 20, . . . are made inoperable by the output of write control circuit 21.

A write operation progresses in the same way as that of the read operation until one word line 14 is selected. Write signal terminal 22 is at the write-mode level. The output of write control circuit 21 enables writing circuit 20 to be ready for the write operation. Data D supplied to data input/output terminal 25 is written via data input/output circuit 24 and column decoder 23 into memory cell 18 connected to the pair of bit lines 15₁ and 15₂ in the column, which has been selected by column decoder 23.

On the other hand, when memory clear signal MC is at "1" level, all of the memory cells 18 are selected. The data is then simultaneously written into all of the memory cells 18 by the writing circuits 20. This eliminates the need for sequentially writing data into the memory cells, while also sequentially changing the address. Thus memory clear can be accomplished in a short time. Therefore, in a system using this semiconductor memory device, such as an image data processing system using a microcomputer, the memory can be utilized in a high efficiency. Furthermore, the paired bit lines $15_1$ and $15_2$ are disconnected from Vpc terminal 17, by the off-state of transistors Q1 and Q2 which make up the precharge circuit. This feature prevents the current from flowing from precharge power source Vpc terminal 17 to the ground terminal via transistors Q1 and Q2, the pair of bit lines $15_1$ and $15_2$, and line selecting transistors Q7 and Q8. This keeps the power consumption low even when data is simultaneously written into all of the memory cells 18, 18, . . . .

In the above-mentioned embodiment, E/R type, which includes enhancement type transistors and high-resistance loads, is used for the memory cell. It should be noted that the same effect of the invention can be obtained when memories of E/E type, E/D (depletion type transistor) type, or CMOS (complementary MOS) type are used.

Figure 5:
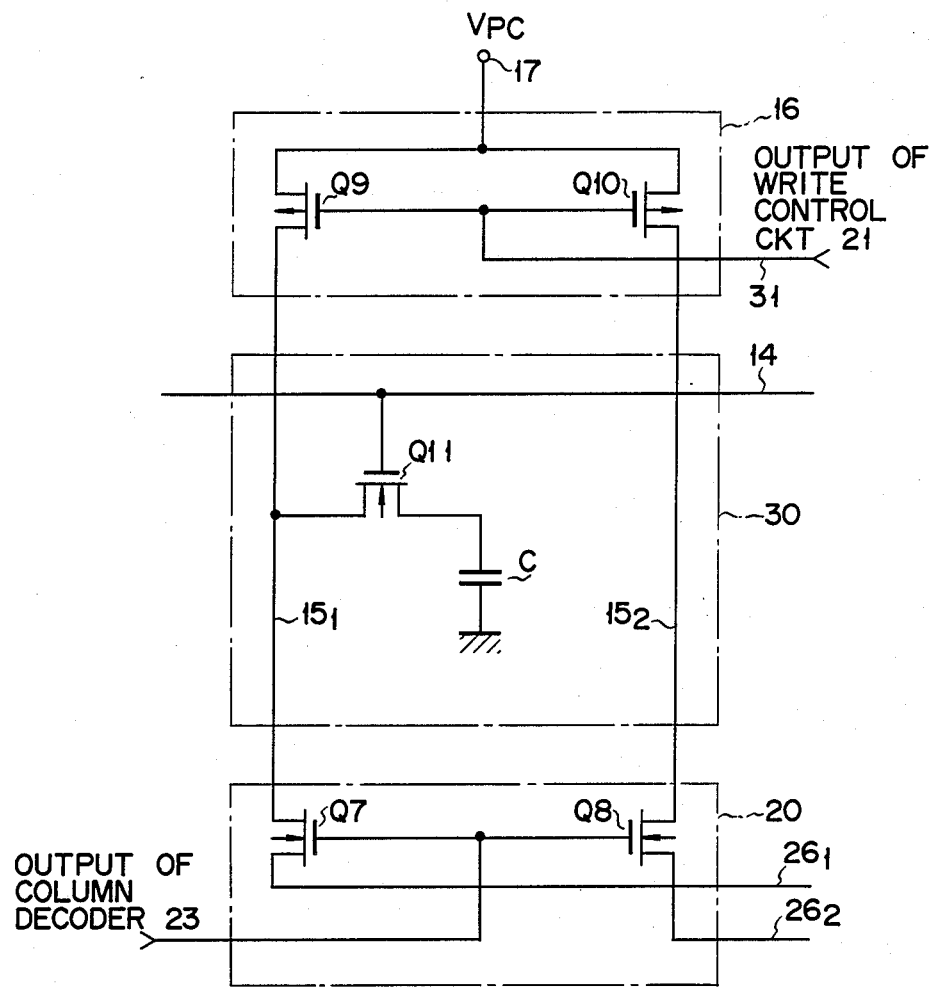
FIG. 5 shows configurations of a precharge circuit, a memory cell and writing circuit of the FIG. 4 device.

FIG. 10 shows a second embodiment of this invention. In the second embodiment, the circuit portion 38 enclosed by a one-dot-chain line in FIG. 6, is expressed by one block containing a memory array and its related circuits. In the embodiment, a plurality of circuit portions $38_1, \ldots 38n$ shown by blocks are provided. In such a configuration, since circuit portions $38_l$ to $38_n$ have data input portions, i.e., data input/output terminals $25_1$ to $25_n$, respectively, any data $D_l$ to $D_n$ can be simultaneously written into the memory cells of the memory arrays of respective blocks $38_l$ to $38_n$. In both first and second embodiments, the SRAM is used. To apply this invention to the DRAM, a configuration as shown in FIG. 11 will be used. The same components as those in the FIG. 6 circuit are denoted by the same reference numerals, and hence their detailed description will be omitted. The FIG. 11 circuit differs the FIG. 6 circuit only in that precharge circuit 16 is controlled not by memory clear signal MC, but by the output of write control circuit 21. Precharge circuit 16, memory cell 30 and writing circuit 20 have the same configurations as those in the FIG. 5.

The FIG. 11 circuit with the above configuration performs basically the same operation as the FIG. 6 circuit, and offers the same effect. As a matter of course, the FIG. 11 circuit can be modified in the same way as the FIG. 10 circuit.

As described above, according to this invention, a semiconductor memory device which enables the same data to be simultaneously written into all the memory cells, can be realized.

What is claimed is:

1. A semiconductor memory device for simultaneously writing same data into all memory cells by a writing circuit in a clear mode, said device comprising:
   a plurality of memory cells for storing data;
   bit lines for performing data transfer to and from the memory cells;
   a sense amplifier for amplifying the data read out from the memory cells onto the bit lines;
   a writing circuit for writing data into said memory cells via said bit lines;
   word lines for selecting said memory cells;
   a row decoder for selecting said word lines;
   a column decoder for selecting said bit lines;
   an address input circuit for supplying an address signal to the column decoder;
   load means provided between said bit lines and a potential source, said load means being set in an off-state by the supply of a memory clear signal; and
   control means for controlling said decoders when said memory clear signal is supplied so as to set all the word lines in a selective state.

2. A semiconductor memory device for simultaneously writing same data into all memory cells by a writing circuit in a clear mode, said device comprising:
   a plurality of memory cells for storing data;
   bit lines for performing data transfer to and from the memory cells;
   sense amplifiers for amplifying the data read out from the memory cells onto the bit lines;
   writing circuits for writing data into said memory cells via said bit lines;
   grouped word lines, each of said word lines for selecting a memory cell in one of grouped memory cells;
   a row decoder for selecting a group of word lines;
   a column decoder for selecting said bit lines;
   an address input circuit for supplying an address signal to the column decoder;
   load means provided between said bit lines and a potential source, said load means being set in an off-state by the supply of a memory clear signal; and
   control means for setting said grouped word lines in a selective state for each group of said memory cell when said memory clear signal is supplied.

3. The semiconductor memory device according to claim 1, wherein each of said decoders includes first and second NAND gates, for NANDing address signals, a NOR gate for receiving the outputs of said first and second NAND gates, and a MOS transistor connected between the output of the second NAND gate and a reference potential, and being supplied at the gate with said memory clear signal.

4. The semiconductor memory device according to claim 1, wherein said load means includes a MOS transistor provided between said bit lines and said potential source, for receiving, at the gate, said memory clear signal.

5. The semiconductor memory device according to claim 1, wherein each of said memory cells is a dynamic memory cell which includes a capacitor and a MOS transfer gate.

6. The semiconductor memory device according to claim 1, wherein each of said memory cells is a static memory cell which includes a flip-flop made up of a pair of load elements and a pair of driving MOS transistors, and a MOS transistor used as a transfer gate and provided between said bit lines and the flip-flop.

* * * * *